US006773980B2

(12) United States Patent
Kraus et al.

(10) Patent No.: US 6,773,980 B2
(45) Date of Patent: Aug. 10, 2004

(54) METHODS OF FORMING A FIELD EMISSION DEVICE

(75) Inventors: Brenda D. Kraus, Meridian, ID (US); Richard H. Lane, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 5 days.

(21) Appl. No.: 10/334,382

(22) Filed: Dec. 30, 2002

(65) Prior Publication Data

US 2003/0134443 A1 Jul. 17, 2003

Related U.S. Application Data

(62) Division of application No. 10/041,896, filed on Jan. 7, 2002, which is a division of application No. 09/641,879, filed on Aug. 17, 2000, which is a division of application No. 09/248,197, filed on Feb. 10, 1999.

(51) Int. Cl.[7] .......................................... H01L 21/8242
(52) U.S. Cl. ...................... 438/239; 438/253; 438/396; 438/660; 438/762
(58) Field of Search ................................. 438/239, 253, 438/396, 627, 644, 635, 660, 762, 780, 381–386

(56) References Cited

U.S. PATENT DOCUMENTS

| 5,062,133 | A | 10/1991 | Melrose |
| 5,183,684 | A | 2/1993 | Carpenter .................. 427/574 |
| 5,208,848 | A | 5/1993 | Pula |
| 5,351,276 | A | 9/1994 | Doll, Jr. et al. |
| 5,356,608 | A | 10/1994 | Gebhardt .................... 423/412 |
| 5,386,459 | A | 1/1995 | Veeneman et al. |
| 5,390,241 | A | 2/1995 | Bales et al. |
| 5,392,345 | A | 2/1995 | Otto |
| 5,404,400 | A | 4/1995 | Hamilton |
| RE35,050 | E | 10/1995 | Gibbs et al. |
| 5,459,780 | A | 10/1995 | Sand |
| 5,463,685 | A | 10/1995 | Gaechter et al. |
| 5,536,193 | A | 7/1996 | Kumar ......................... 445/50 |
| 5,573,742 | A | 11/1996 | Gebhardt .................... 423/412 |

(List continued on next page.)

FOREIGN PATENT DOCUMENTS

JP          401230779 A       9/1989

OTHER PUBLICATIONS

Armas et al., *Chemical Vapor Deposition of $Si_3N_4$ and AlN on Carbon Fibers*, Chemical Vapor Deposition, 87–8 Electrochemical Society Proceedings, pp. 1060–1069 (1987).

(List continued on next page.)

*Primary Examiner*—Carl Whitehead, Jr.
*Assistant Examiner*—Yennhu B. Huynh
(74) *Attorney, Agent, or Firm*—Wells St. John P.S.

(57) ABSTRACT

The invention is a method of depositing an aluminum nitride comprising layer over a semiconductor substrate, a method of forming DRAM circuitry, DRAM circuitry, a method of forming a field emission device, and a field emission device. In one aspect, a method of depositing an aluminum nitride comprising layer over a semiconductor substrate includes positioning a semiconductor substrate within a chemical vapor deposition reactor. Ammonia and at least one of triethylaluminum and trimethylaluminum are fed to the reactor while the substrate is at a temperature of about 500° C. or less and at a reactor pressure from about 100 mTorr to about 725 Torr effective to deposit a layer comprising aluminum nitride over the substrate at such temperature and reactor pressure. In one aspect, such layer is utilized as a cell dielectric layer in DRAM circuitry. In one aspect, such layer is deposited over emitters of a field emission display. The invention contemplates DRAM and field emission devices utilizing such layer and alternate layers.

29 Claims, 3 Drawing Sheets

U.S. PATENT DOCUMENTS

| | | | |
|---|---|---|---|
| 5,599,732 A | 2/1997 | Razeghi | 437/105 |
| 5,605,858 A | 2/1997 | Nishioka et al. | 437/60 |
| 5,650,361 A | 7/1997 | Radhakrishnan | 437/237 |
| 5,656,113 A | 8/1997 | Ikeda et al. | 156/89 |
| 5,682,386 A | 10/1997 | Arimilli et al. | |
| 5,687,112 A | 11/1997 | Ovshinsky | 365/163 |
| 5,689,553 A | 11/1997 | Ahuja et al. | |
| 5,709,928 A | 1/1998 | Ikeda et al. | 428/212 |
| 5,767,578 A | 6/1998 | Chang et al. | 257/717 |
| 5,773,882 A | 6/1998 | Iwasaki | 257/692 |
| 5,783,483 A | 7/1998 | Gardner | 438/627 |
| 5,783,716 A | 7/1998 | Baum et al. | 556/136 |
| 5,786,259 A | 7/1998 | Kang | 438/396 |
| 5,786,635 A | 7/1998 | Alcoe et al. | 257/718 |
| 5,852,303 A | 12/1998 | Cuomo et al. | 257/9 |
| 5,977,698 A | 11/1999 | Lee | |
| 6,072,211 A | 6/2000 | Miller et al. | |
| 6,128,293 A | 10/2000 | Pfeffer | |
| 6,181,056 B1 * | 1/2001 | Yaniv et al. | 313/310 |
| 6,218,293 B1 | 4/2001 | Kraus et al. | 438/644 |
| 6,218,771 B1 * | 4/2001 | Berishev et al. | 313/311 |
| 6,294,420 B1 | 9/2001 | Tsu et al. | 438/239 |
| 6,307,775 B1 | 10/2001 | Forbes et al. | 365/185.01 |
| 6,358,810 B1 | 3/2002 | Dornfest et al. | |
| 6,459,096 B1 * | 10/2002 | Razeghi | 257/14 |

OTHER PUBLICATIONS

Jimenez et al., *Preparation of aluminum nitride films by low pressure organometallic chemical vapor deposition*, 76–77 Surface and Coatings Technology, pp. 372–376 (1995).

Kobayashi et al., *Improved 2DEG Mobility in Seletively Doped GaAs/N–AlGaAs Grown by MOCVD Using . . .* , Musashino Elect. Comm. Lab., Nippon Tel & Telegraph, 2 pages (1984).

Liu et al., *The surface chemistry of aluminum nitride MOCVD on alumina using trimethylaluminum and ammonia as precursors,* 320 Surface Science, pp. 145–160 (1994).

Pierson, *The CVD of Ceramic Materials,* Handbook of Chemical Vapor Deposition (CVD), Principles, Technology and Applications, pp. 216–219 (pre–Feb., 1999).

CFD of Nonmetals, Editor: William S. Rees, Jr., pp. 301–307 (1996).

Suzuki et al., *CVD of Polycrystalline Aluminum Nitride, Chemical Vapor Deposition 1987,* 87–8 Electrochemical Society Proceedings, pp. 1089–1097 (1987).

* cited by examiner

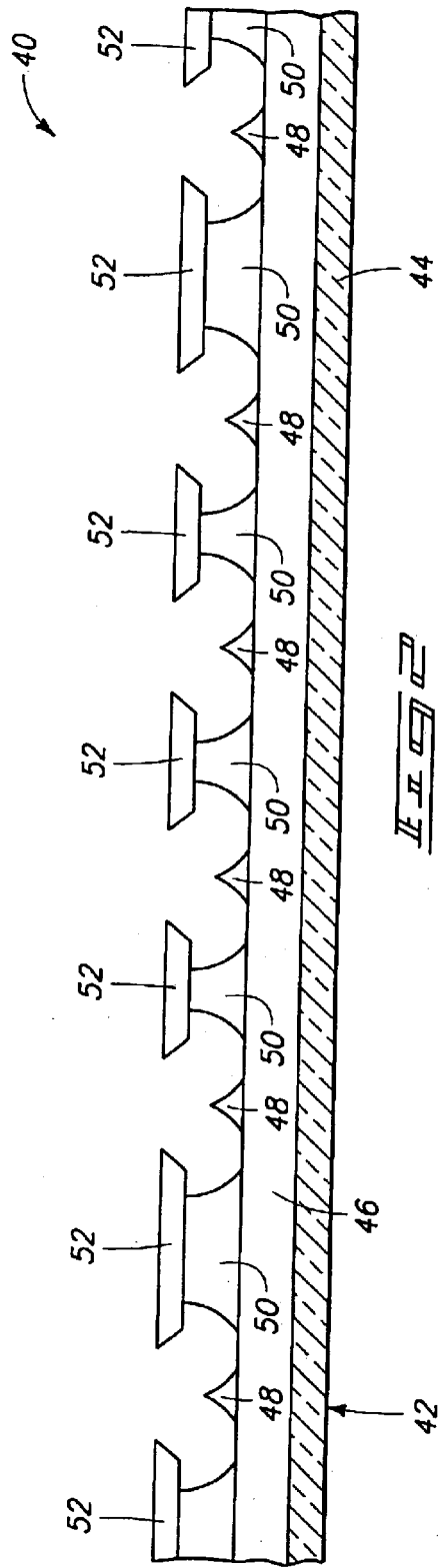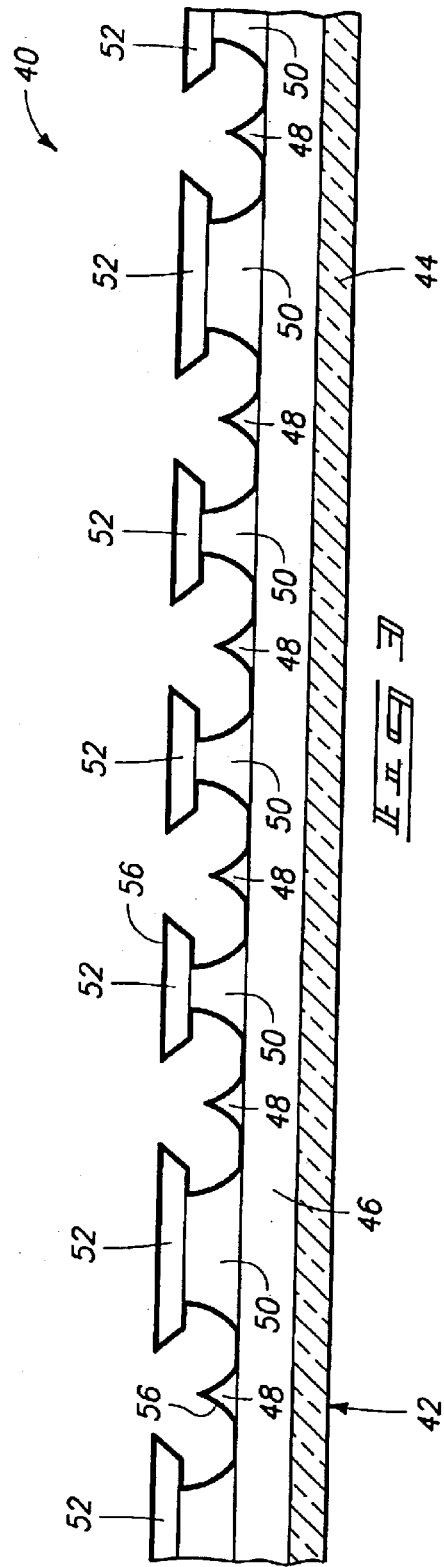

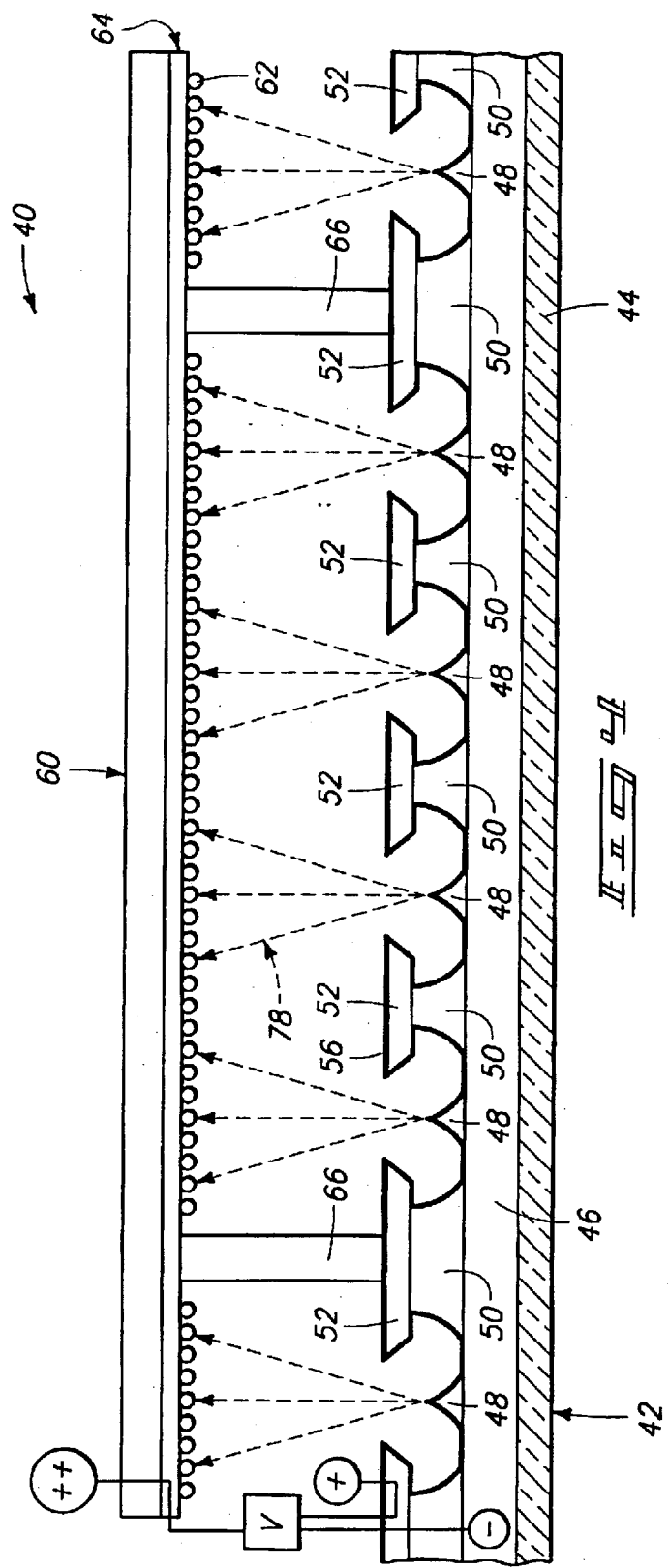

METHODS OF FORMING A FIELD EMISSION DEVICE

RELATED PATENT DATA

This patent resulted from a divisional application of U.S. patent application Ser. No 10/041,896, filed Jan. 7, 2002, entitled "DRAM Circuitry Having Storage Capacitors Which Include Capacitor Dielectric Regions Comprising Aluminum Nitride", naming Brenda D. Kraus and Richard H. Lane as inventors, the disclosure of which is incorporated by reference; which resulted from a divisional application of U.S. patent application Ser. No. 09/641,879, filed Aug. 17, 2000, entitled "Methods of Forming DRAM Circuitry, DRAM Circuitry, Method of Forming a Field Emission Device, and Field Emission Device", naming Brenda D. Kraus and Richard H. Lane as inventors, now U.S. Pat. No. 6,376,305 B1; which resulted from a divisional application of U.S. patent application Ser. No. 09/248,197, filed Feb. 10, 1999, entitled "Method of Depositing an Aluminum Nitride Comprising Layer Over a Semiconductor Substrate", naming Brenda D. Kraus and Richard H. Lane as inventors, now U.S. Pat. No. 6,352,944 B1.

TECHNICAL FIELD

This invention relates to methods of depositing aluminum nitride comprising layers over semiconductor substrates, to methods of forming DRAM circuitry, to DRAM circuitry, to methods of forming field emission devices, and to field emission devices.

BACKGROUND OF THE INVENTION

This invention was principally motivated in addressing problems and improvements in dynamic random access memory (DRAM) and in field emission devices, such as displays.

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs will be on the order of 0.25 micron or less, and conventional dielectrics such as $SiO_2$ and $Si_3N_4$ might not be suitable because of small dielectric constants. Highly integrated memory devices, such as 256 Mbit DRAMs and beyond, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness.

Field emission displays are one type of field emission device, and are utilized in a variety of display applications. Conventional field emission displays include a cathode plate having a series of emitter tips fabricated thereon. The tips are configured to emit electrons toward a phosphor screen to produce an image. The emitters are typically formed from an emitter material such as conductive polysilicon, molybdenum, or aluminum. Multiple emitters are typically utilized to excite a single pixel. For example, 120 emitters may be used for a single pixel. Individual pixels contain a deposited one of red, green, or blue phosphor.

Clarity, or resolution, of a field emission display is a function of a number of factors, including emitter tip sharpness. Specifically, sharper emitter tips can produce higher resolution displays than less sharp emitter tips. One adverse phenomenon impacting emitter tip sharpness is undesired native oxidation of the emitter tips during fabrication if exposed to an oxidizing atmosphere, such as room air. Such oxidation consumes material of the tips in forming an oxide and reduces sharpness and therefore clarity.

SUMMARY OF INVENTION

The invention is a method of depositing an aluminum nitride comprising layer over a semiconductor substrate, a method of forming DRAM circuitry, DRAM circuitry, a method of forming a field emission device, and a field emission device. In one aspect, a method of depositing an aluminum nitride comprising layer over a semiconductor substrate includes positioning a semiconductor substrate within a chemical vapor deposition reactor. Ammonia and at least one compound of the formula $R_3Al$, where "R" is an alkyl group or a mixture of alkyl groups, are fed to the reactor while the substrate is at a temperature of about 500° C. or less and at a reactor pressure from about 100 mTorr to about 725 Torr effective to deposit a layer comprising aluminum nitride over the substrate at such temperature and reactor pressure. In one aspect, such layer is utilized as a cell dielectric layer in DRAM circuitry. In one aspect, such layer is deposited over emitters of a field emission display.

In one aspect, the invention includes DRAM circuitry having an array of word lines forming gates of field effect transistors and an array of bit lines. Individual field effect transistors have a pair of source/drain regions. A plurality of memory cell storage capacitors are associated with the field effect transistors. Individual storage capacitors have a first capacitor electrode in electrical connection with one of a pair of source/drain regions of one of the field effect transistors and a second capacitor electrode. A capacitor dielectric region is received intermediate the first and second capacitor electrodes, with the region comprising aluminum nitride, and the other of the pair of source/drain regions of the one field effect transistor being in electrical connection with one of the bit lines.

In one aspect, a field emission device includes an electron emitter substrate including emitters having at least a partial covering comprising an electrically insulative material other than an oxide of silicon, with aluminum nitride being but one example. An electrode collector substrate is spaced from the electron emitter substrate.

BRIEF DESCRIPTION OF THE DRAWINGS

Preferred embodiments of the invention are described below with reference to the following accompanying drawings.

FIG. 2 is a diagrammatic sectional view of an example field emission device substrate having emitters in accordance with an aspect of the invention.

FIG. 3 is a view of the FIG. 2 device at a processing step subsequent to that shown by FIG. 2.

FIG. 4 is a schematic, sectional view of one embodiment of a field emission display incorporating the example FIG. 3 substrate.

DETAILED DESCRIPTION OF THE PREFERRED EMBODIMENTS

Figure 1:
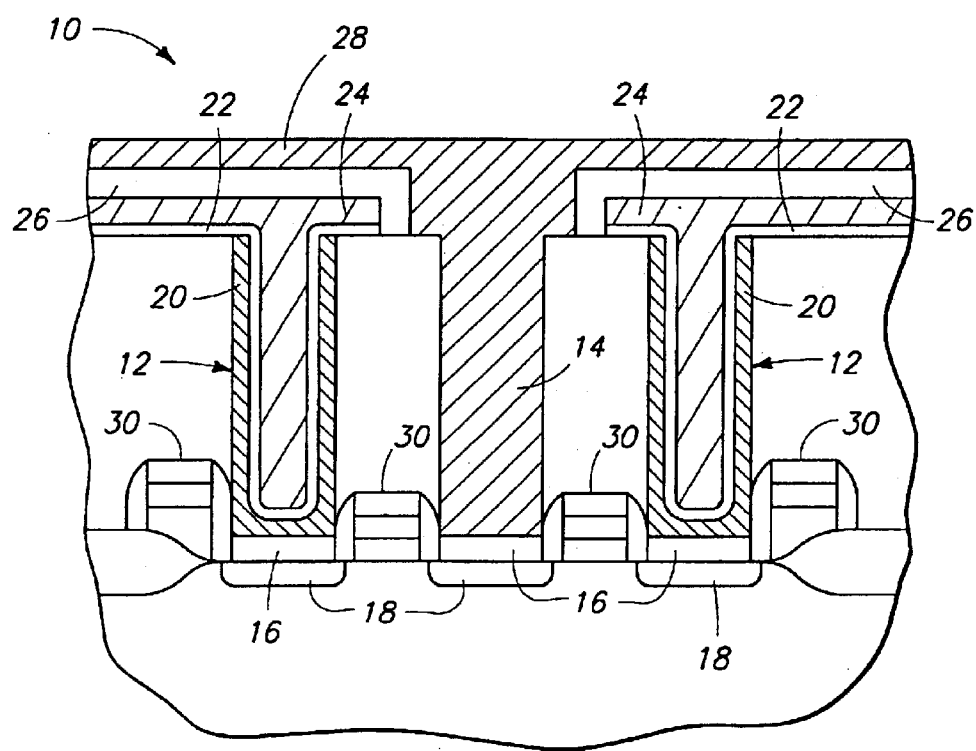
FIG. 1 is a diagrammatic sectional view of a semiconductor wafer fragment comprising example DRAM circuitry in accordance with an aspect of the invention.

This disclosure of the invention is submitted in furtherance of the constitutional purposes of the U.S. Patent Laws "to promote the progress of science and useful arts" (Article 1, Section 8).

In one implementation of the invention, a semiconductor substrate is positioned within a chemical vapor deposition reactor. Ammonia and at least one compound of the formula $R_3Al$, where "R" is an alkyl group or a mixture of alkyl groups, is fed to the reactor while the substrate is at a temperature of about 500° C. or less, and at a reactor pressure from about 100 mTorr to about 725 Torr, effective to deposit a layer comprising aluminum nitride over the substrate at such temperature and reactor pressure. Example compounds include those which have three of the same alkyl groups, such as triethylaluminum and trimethylaluminum, and those which have at least two different alkyl groups, for example methyldiethlyaluminum, dimethylethylaluminum etc. Substrate temperature is preferably kept at greater than or equal to about 250° C., with from about 380° C. to about 420° C. being more preferred. Substrate temperature and reactor pressure are preferably maintained substantially constant during the feeding and deposit. Preferred reactor pressure is from about 10 Torr to about 100 Torr. Plasma is preferably not utilized, and the aluminum nitride is preferably substantially amorphous. In the context of this document, "substantially amorphous" is meant to define a material which is at least 90% amorphous. Aluminum nitride layer deposition in these manners can have reduced carbon and oxygen incorporation.

In a specific example, a liquid volume of triethylaluminum was maintained at a temperature of 75° C. Helium was flowed through this liquid at the rate of 100 sccm and into a chemical vapor deposition chamber within which a semiconductor wafer was received and maintained at the temperature of 450° C. Ammonia was also flowed to the reactor through a showerhead at the rate of 100 sccm. Reactor pressure was 10 Torr. Five minutes of processing in this manner produced an amorphous layer consisting essentially of aluminum nitride which was 1300 Angstroms thick. Resistivity in the layer was some value greater than 1000 microohm-cm. Oxygen content was determined to be 0.1%, with carbon content being below the detection limit of the analysis tool, namely a carbon content of less than 1%.

The invention contemplates DRAM circuitry comprising a capacitor dielectric region formed by aluminum nitride layer deposition in accordance with the above and other methods. Referring to FIG. 1, a wafer fragment 10 comprises two memory cells, with each comprising a memory cell storage capacitor 12 and a shared bit contact 14. Capacitors 12 electrically connect with substrate diffusion regions 18 through polysilicon regions 16. Diffusion regions 18 constitute a pair of source/drain regions for individual field effect transistors. Individual storage capacitors 12 comprise a first capacitor electrode 20 in electrical connection with one of a pair of source/drain regions 18 of one field effect transistor, and a second capacitor electrode 24. A capacitor dielectric region 22 is received intermediate first capacitor electrode 20 and second capacitor electrode 24. Region 22 comprises aluminum nitride, preferably deposited for example by the method described above.

Preferred as shown, region 22 contacts each of first capacitor electrode 20 and second capacitor electrode 24, and preferably consists essentially of aluminum nitride. A native oxide might form on the facing surfaces of at least one of first capacitor electrode 20 and second capacitor electrode 24, whereby the capacitor dielectric layer region would then consist essentially of aluminum nitride and native It oxide in one preferred embodiment. The aluminum nitride of capacitor dielectric layer region 22 is preferably substantially amorphous, and deposited to an example thickness less than or equal to 60 Angstroms. More preferred, is a thickness which is less than or equal to 50 Angstroms, with both being thinner than conventional oxide-nitride-oxide capacitor dielectric layers commonly used in much existing DRAM circuitry.

An insulating layer 26 is formed over second capacitor electrode 24. A bit line 28 of an array of bit lines is fabricated in electrical connection with bit contact 14. An array of word lines 30 is fabricated to constitute gates of individual field effect transistors to enable selective gating of the capacitors relative to bit contact 14.

Other aspects of the invention are described with reference to FIGS. 2 through 4. FIG. 2 illustrates a field emission device in the form of field emission display 40 in fabrication. In the depicted example, such comprises an electron emitter substrate 42 formed of a glass plate 44 having a first semiconductive material 46 formed thereover. Semiconductive material 46 might comprise either a p-type doped or an n-type doped semiconductive material (such as, for example, monocrystalline silicon). Emitters 48 are provided in electrical connection with layer 46, and preferably comprise a second semiconductive material, for example doped polycrystalline silicon. Exemplary dielectric regions 50, such as borophosphosilicate glass, are provided over material 46 and intermediate emitters 48. An electrically conductive extraction grid 52 is provided over dielectric material 50 and accordingly is outwardly of and spaced from emitters 48.

Referring to FIG. 3 and in one aspect of the invention, an electrically insulative material 56, other than an oxide of silicon, is provided at least in partial covering relation over emitters 48. Such is an improvement over native oxide coverings, which both consume emitter material and appreciably dull the emitter tips. Further in one considered aspect of the invention, layer 56 constitutes at least a partial covering comprising aluminum nitride relative to emitters 48. In the preferred embodiment and as shown, layer 56 is provided to entirely cover emitters 48 and is formed after formation of extraction grid 52 and also is formed on extraction grid 52. An example and preferred deposition thickness for layer/covering 56 is from about 50 Angstroms to about 150 Angstroms. A preferred process for depositing covering 56 in a substantially conformal and non-selective manner is as described above, utilizing ammonia and at least one compound of the formula $R_3Al$, where "R" is an alkyl group or a mixture of alkyl groups, at a temperature or less than or equal to about 500° C. and a reactor pressure of from about 100 mTorr to about 725 Torr. Such a layer can be deposited to be sufficiently smooth to not significantly adversely affect tip sharpness, and is a material which reduces the effective work function of the emitter tips, thereby reducing the required operating voltage.

Referring to FIG. 4, electron emission substrate 42 is joined with an electron collector substrate 60. Such is shown in the form of a transparent face plate comprising phosphors 62 formed on a luminescent screen 64. Spacers 66 separate and support electron collector substrate 60 relative to electron emission substrate 42. Electron emission 78 from emitters 48 causes phosphors 62 to luminesce and a display to be visual through face plate 60. Techniques for forming field emission displays are described in U.S. Pat. Nos. 5,151,061; 5,186,670; and 5,210,472, hereby expressly incorporated by reference herein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a field emission device comprising:
   forming an electron emission substrate comprising projecting emitters;
   providing the emission substrate within a chemical vapor deposition reactor;
   feeding ammonia and at least one compound of the formula $R_3Al$, where "R" is an alkyl group or a mixture of alkyl groups, to the reactor while the electron emission substrate is at a temperature of about 500° C. or less and at a reactor pressure from about 100 mTorr to about 725 Torr effective to deposit a layer comprising substantially amorphous and electrically insulative aluminum nitride over at least a portion of the projecting emitters; and
   after the deposit, joining the electron emission substrate with an electron collector substrate.

2. The method of claim 1 wherein the electron collector substrate comprises a face plate comprising phosphor, and comprising forming the device to comprise a field emission display.

3. The method of claim 1 wherein the electron emission substrate comprises a conductive extraction grid formed outwardly of and spaced from the projecting emitters, the deposit occurring after formation of the extraction grid.

4. The method of claim 1 wherein the electron emission substrate comprises a conductive extraction grid formed outwardly of and spaced from the projecting emitters, the deposit occurring after formation of the extraction grid and also occurring on the extraction grid.

5. The method of claim 1 wherein the compound comprises triethylaluminum.

6. The method of claim 1 wherein the compound comprises trimethylaluminum.

7. The method of claim 1 wherein the compound comprises at least two different alkyl groups.

8. The method of claim 1 wherein the compound comprises at least one methyl group and at least one ethyl group.

9. The method of claim 1 wherein electron emission substrate temperature is greater than or equal to about 250° C. during the feeding.

10. The method of claim 1 wherein electron emission substrate temperature is from about 380° C. to about 420° C. during the feeding.

11. The method of claim 1 wherein electron emission substrate temperature and reactor pressure are maintained substantially constant during the feeding and deposit.

12. The method of claim 1 wherein the reactor is void of plasma during the depositing.

13. The method of claim 1 wherein the reactor pressure is from about 10 Torr to about 100 Torr.

14. The method of claim 13 wherein electron emission substrate temperature is greater than or equal to about 250° C. during the feeding.

15. The method of claim 13 wherein electron emission substrate temperature is from about 380° C. to about 420° C. during the feeding.

16. The method of claim 13 wherein electron emission substrate temperature and reactor pressure are maintained substantially constant during the feeding and deposit.

17. The method of claim 13 wherein the reactor is void of plasma during the depositing.

18. The method of claim 1 wherein the feeding is effective deposit the layer comprising substantially amorphous and electrically insulative aluminum nitride over all of all of the projecting emitters.

19. A method of forming a field emission device comprising:
   forming an electron emission substrate comprising projecting emitters;
   providing the emission substrate within a chemical vapor deposition reactor;
   heating the emission substrate within the deposition reactor to a temperature from about 250° C. to about 420° C.;
   providing a pressure within the deposition reactor from about 100 mTorr to about 725 Torr; and
   with the substrate at the temperature and the reactor at the pressure, feeding ammonia and at least one compound of the formula $R_3Al$, where "R" is an alkyl group or a mixture of alkyl groups, to the reactor effective to form a layer comprising substantially amorphous and electrically insulative aluminum nitride over at least a portion of the projecting emitters.

20. The method of claim 19 wherein substrate temperature and deposition reactor pressure are maintained substantially constant during the feeding and the forming.

21. The method of claim 19 wherein the deposition reactor is void of plasma during the depositing.

22. The method of claim 19 wherein the compound comprises triethylaluminum or trimethylaluminum.

23. The method of claim 19 wherein the compound comprises at least two different alkyl group.

24. The method of claim 19 wherein the compound comprises at least one methyl group and at least one ethyl group.

25. The method of claim 19 wherein the reduced pressure is from between about 10 Torr to about 100 Torr.

26. The method of claim 19 further comprising after forming the substantially amorphous aluminum nitride, joining the electron emission substrate with an electron collector substrate.

27. The method of claim 19 wherein the electron emission substrate comprises a conductive extraction grid formed outwardly of and spaced from the projecting emitters, the deposit occurring after formation of the extraction grid.

28. The method of claim 19 wherein the electron emission substrate comprises a conductive extraction grid formed outwardly of and spaced from the projecting emitters, the deposit occurring after formation of the extraction grid and also occurring on the extraction grid.

29. The method of claim 19 wherein the feeding is effective deposit the layer comprising substantially amorphous and electrically insulative aluminum nitride over all of all of the projecting emitters.

* * * * *

UNITED STATES PATENT AND TRADEMARK OFFICE
CERTIFICATE OF CORRECTION

PATENT NO. : 6,773,980 B2
DATED : August 10, 2004
INVENTOR(S) : Kraus et al.

It is certified that error appears in the above-identified patent and that said Letters Patent is hereby corrected as shown below:

Title page,
Item [56], References Cited, U.S. PATENT DOCUMENTS, please insert
-- 6,372,530    4/2002    Lee --.

Column 3,
Line 63, please delete "It" after "native".

Column 4,
Line 44, please delete "or" after "temperature" and insert -- of --.

Column 6,
Line 6, please insert -- to -- after "effective".
Line 8, please delete "all of" after "all of".
Line 39, please delete "group" after "alkyl" and insert -- groups --.
Line 60, please insert -- to -- after "effective".
Line 62, please delete "of" after "all of".

Signed and Sealed this

Twenty-second Day of February, 2005

JON W. DUDAS
*Director of the United States Patent and Trademark Office*